United States Patent
Ruscio et al.

(10) Patent No.: US 10,595,563 B2
(45) Date of Patent: Mar. 24, 2020

(54) MONOLITHIC PLANE WITH ELECTRICAL CONTACTS

(71) Applicant: Philip Morris Products S.A., Neuchatel (CH)

(72) Inventors: Dani Ruscio, Cressier (CH); Dominique Paul Gabriel Stohr, Belfaux (CH); Joel Fontannaz, Bulle (CH); Christian Mathieu, Remoray (FR)

(73) Assignee: Philip Morris Products S.A., Neuchatel (CH)

( * ) Notice: Subject to any disclaimer, the term of this patent is extended or adjusted under 35 U.S.C. 154(b) by 30 days.

(21) Appl. No.: 15/559,067

(22) PCT Filed: Mar. 22, 2016

(86) PCT No.: PCT/EP2016/056291
§ 371 (c)(1),
(2) Date: Sep. 18, 2017

(87) PCT Pub. No.: WO2016/150979
PCT Pub. Date: Sep. 29, 2016

(65) Prior Publication Data
US 2018/0070636 A1    Mar. 15, 2018

(30) Foreign Application Priority Data

Mar. 25, 2015  (EP) .................................... 15160921

(51) Int. Cl.
*A24F 13/00*   (2006.01)
*A24F 17/00*   (2006.01)
(Continued)

(52) U.S. Cl.
CPC .......... *A24F 47/008* (2013.01); *H05K 1/0213* (2013.01)

(58) Field of Classification Search
CPC .................................................. A24F 47/008
(Continued)

(56) References Cited

U.S. PATENT DOCUMENTS 7,997,280 B2 * 8/2011 Rosenthal ............ A61M 11/041
                                                          128/202.21
2015/0020831 A1 * 1/2015 Weigensberg ........ A24F 47/008
                                                             131/329
(Continued)

FOREIGN PATENT DOCUMENTS

CN          201226775 Y    4/2009
CN          103431524 A    12/2013
(Continued)

OTHER PUBLICATIONS

International Search Report and Written Opinion dated Jun. 17, 2016 in PCT/EP2016/056291, filed Mar. 22, 2016.
(Continued)

*Primary Examiner* — Abdullah A Riyami
*Assistant Examiner* — Thang H Nguyen
(74) *Attorney, Agent, or Firm* — Oblon, McClelland, Maier & Neustadt, L.L.P.

(57) ABSTRACT

An electrically operated aerosol-generating device is provided, including an electrical power supply; an electronic circuit board; an external electrical power contact; an electrical power line, configured to electrically couple the external electrical power contact to the electronic circuit board; and a ground plane including an elongate conductive member connected to a negative terminal of the electrical power supply and being configured to electrically couple the power supply to the electronic circuit board, and to structurally retain the electrical power supply and the electronic circuit board, configured to electrically couple the power supply to the electronic circuit board and to structurally retain the power supply and electronic circuit board, the ground plane being further configured to electrically insulate the electrical power line from the elongate conductive member, and to
(Continued)

mechanically couple the electrical power line to the elongate conductive member.

12 Claims, 4 Drawing Sheets

(51) Int. Cl.
    *A24F 25/00*     (2006.01)
    *A24F 47/00*     (2020.01)
    *H05K 1/02*     (2006.01)

(58) Field of Classification Search
    USPC .................................................. 131/329, 328
    See application file for complete search history.

(56) References Cited

U.S. PATENT DOCUMENTS

| | | | |
|---|---|---|---|
| 2016/0192705 A1* | 7/2016 | Borkovec | A24F 47/008 131/328 |
| 2016/0261021 A1* | 9/2016 | Marion | A24F 47/008 |
| 2017/0079331 A1* | 3/2017 | Monsees | A61M 15/06 |
| 2017/0094998 A1* | 4/2017 | Bernauer | B23P 19/00 |

FOREIGN PATENT DOCUMENTS

| | | |
|---|---|---|
| CN | 203 424 301 U | 2/2014 |
| CN | 104135877 A | 11/2014 |
| EP | 2 835 063 A1 | 2/2015 |
| RU | 11 608 U1 | 10/1999 |
| WO | WO 2009/118085 A1 | 10/2009 |
| WO | WO 2010/118644 A1 | 10/2010 |
| WO | WO 2013/102615 A2 | 7/2013 |
| WO | WO 2015/035510 A1 | 3/2015 |
| WO | WO 2015/139985 A1 | 9/2015 |

OTHER PUBLICATIONS

Combined Office Action and Search Report dated May 20, 2019, in Russian Patent Application No. 2017134819, 18 pages (with unedited computer generated English translation).

Combined Taiwanese Office Action and Search Report dated Jul. 29, 2019 in Taiwanese Patent Application No. 105108675 (with English translation of Search Report only), 6 pages.

Chinese Office Action dated Dec. 23, 2019, with English translation, in corresponding Chinese Patent Application No. 201680015137.1 (10 pages).

* cited by examiner

MONOLITHIC PLANE WITH ELECTRICAL CONTACTS

TECHNICAL FIELD

The present disclosure relates to a monolithic ground plane with electrical contacts. The present disclosure also relates to an electrically operated aerosol generating device having a monolithic ground plane configured to electrically and structurally couple the device components together.

DESCRIPTION OF THE RELATED ART

Electrically heated smoking systems are known. For example, aerosol generating systems, which operate at lower temperatures than conventional lit end cigarettes, are disclosed in WO2009/118085. WO2009/118085 discloses an aerosol generating system that is an electrical smoking system in which an aerosol-forming substrate is heated by a heater element to generate an aerosol. The electrical smoking system also comprises a power supply and an electronic control circuit. The components of the electrical smoking system are housed within a housing of approximately equivalent diameter to a conventional lit end cigarette which can be challenging. The limited dimensions of the electrical smoking system also increase the difficulty of providing suitable electrical connections between the various components. Furthermore, the limited dimensions increase the difficulty of manufacturing the devices at relatively high volume.

It would thus be desirable to provide components for an electrically operated aerosol generating device that can be more easily manufactured.

SUMMARY

According to a first aspect of the present invention, there is provided an electrically operated aerosol-generating device. The device comprises: an electrical power supply; an electronic circuit board; an external electrical power contact; an electrical power line, configured to electrically couple the external electrical power contact to the electronic circuit board; and a ground plane. The ground plane comprises: an elongate conductive member, configured to: electrically couple the power supply to the electronic circuit board; and structurally retain the power supply, and electronic circuit board. The ground plane further comprises: means for electrically insulating the electrical power line from the elongate conductive member; and means for mechanically coupling the electrical power line to the elongate conductive member. Thus, an electrically operated aerosol-generating device may comprise an electrical power supply; an electronic circuit board; an external electrical power contact; an electrical power line, configured to electrically couple the external electrical power contact to the electronic circuit board; and a ground plane. The ground plane comprises an elongate conductive member connected to the negative terminal of the power supply to electrically couple the power supply to the electronic circuit board, the elongate conductive member being configured to structurally retain the power supply and electronic circuit board. The ground plane further comprising means for electrically insulating the electrical power line from, and mechanically coupling the electrical power line to, the elongate conductive member.

BRIEF DESCRIPTION OF THE DRAWINGS

The invention will be further described, by way of example only, with reference to the accompanying drawings in which.

DETAILED DESCRIPTION

Figure 1:
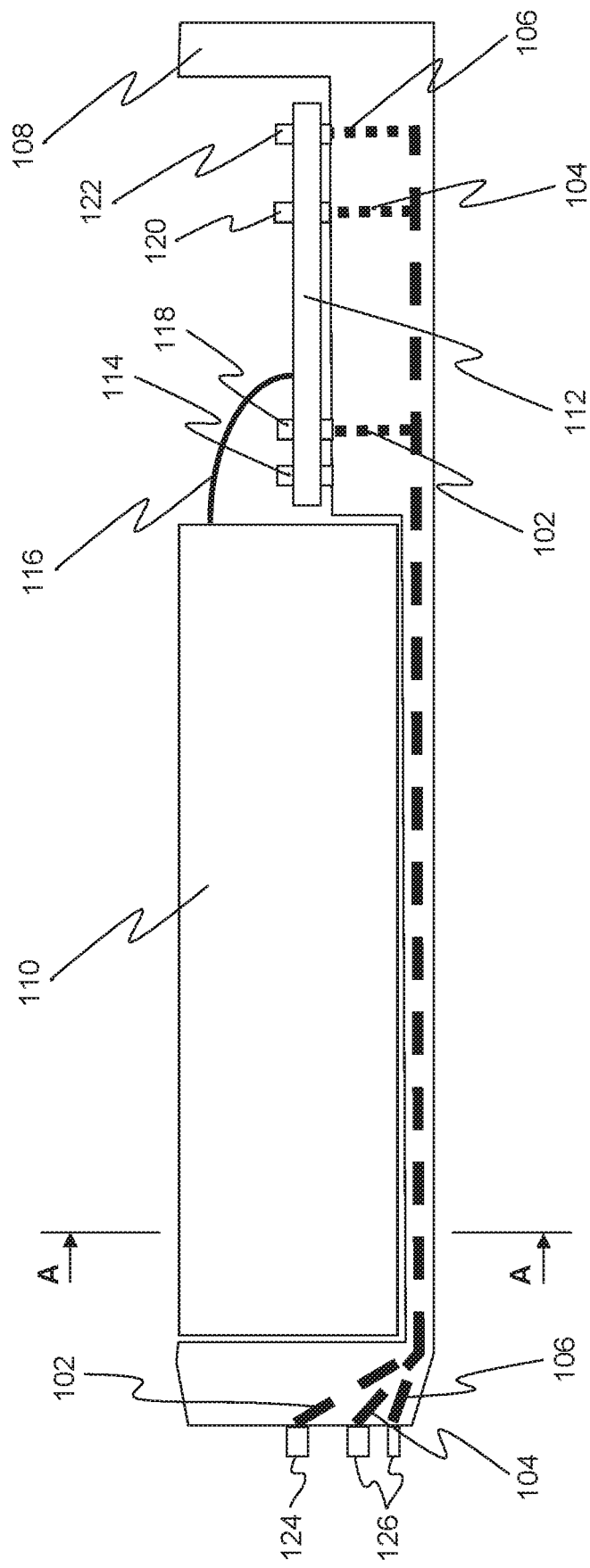
FIG. 1 shows a cross-sectional view of a schematic representation of a ground plane according to one embodiment of the present invention.

The elongate conductive member may be an elongate sheet of conductive material connected to the negative terminal of the power supply. The means for electrically insulating the electrical power line from, and mechanically coupling the electrical power line to, the elongate conductive member may be a frame for electrically insulating the electrical power line from, and for mechanically coupling the electrical power line to, the elongate conductive member.

Advantageously, integrating the electrical power line with the ground plane may reduce the manufacturing complexity and cost of the aerosol-generating device because the components and electrical lines can be electrically and structurally coupled in fewer process steps. In addition, by providing an aerosol-generating device having such a ground plane, the size and complexity of the aerosol generating device can be reduced.

As used herein, the term ground plane refers to an electrically conductive surface that appears as an infinite ground potential to the components of the electrically operated aerosol generating device.

As used herein, the term length is a distance in the longitudinal direction of the aerosol generating device. Consequently, the term width is a distance in the transverse direction of the aerosol generating device.

Preferably, the electrical power line is a substantially rigid electrical power track. By providing a substantially rigid track, the manufacturing process may be yet further simplified as compared to using electrically conductive wires. The electrical power track may have an elongate cross-section. The elongate cross-section may be substantially rectangular. The external electrical contact may be formed from a first end portion of the electrical power track. Alternatively, the external electrical contact may be directly coupled to a first end of the electrical power track. The second end of the electrical power track may form a pin configured to electrically couple the track to the electronic circuit board. The pin is preferably configured to be received in a corresponding hole in the electronic circuit board. The electrical power track may be formed from brass, phosphor bronze, copper, copper alloy, a copper and nickel alloy, copper beryllium alloy, or aluminium. The electrical power track is preferably formed from phosphor bronze.

The electrically operated aerosol-generating device preferably further comprises a frame, structurally retained by the elongate conductive member, configured to mechanically couple the electrical power line to the elongate conductive member. Providing such a frame enables the aerosol-generating device to be manufactured more easily. In known devices, the electrical power line is an electrical wire which is soldered into place, which is a time consuming and difficult operation. Utilising the frame to mechanically couple the electrical power line to the elongate conductive member of the ground plane advantageously enables the electrical connections between the device and each end of the electrical power line to be made more easily.

The frame may be further configured to support the power supply and the electronic circuit board. The electrical power line may be integrally moulded within the frame, and the frame may be formed from an electrical insulator. The electrical insulator may be a polymer material, and is preferably suitable for use in moulding processes, such as injection moulding. The polymer material may be polyphthalamide (PPA), polycarbonate (PC), a blend of polycarbonate and acrylonitrile butadiene styrene (PC-ABS), polyphenylsulfone (PPSU) or polyether ether ketone (PEEK). In each case, the polymer material may be a composite. The composite may comprise carbon fibres, glass fibres, or other mineral fibres.

The frame is preferably integrally moulded with the elongate conductive member. As such, the elongate conductive member and the electrical power line are preferably integrally moulded with the frame in one operation. This may yet further reduce the manufacturing time, complexity and cost.

The ground plane preferably further comprises a plurality of pins configured to receive the electronic circuit board. The plurality of pins are preferably configured to be parallel to each other. Although discussed herein in the context of conveying power from a battery to a circuit board, it will now be apparent to one of ordinary skill in the art that the discussion is not limited to power transfer. Any electrical signal, for example, a data signal, may also be transmitted via the pins when provided in combination with suitable additional electronics.

Providing the plurality of pins on the ground plane, the pins electrically coupled to the elongate conductive member, enables the ground plane to be electrically coupled to the components on the aerosol-generating device such that all of the components are provided with what appears as an infinite ground potential.

The electrically operated aerosol-generating device may further comprise: at least one external electrical data contact; and at least one electrical data line, configured to electrically couple the or each external electrical data contact to the electronic circuit board. The or each electrical data line is electrically insulated from the ground plane and from the electrical power line. The ground plane further comprises means for mechanically coupling the or each electrical data line to the elongate conductive member. The or each electrical data line preferably allows for data communication between an external device and the electronic circuit board.

Similarly to the electrical power track described above, the or each electrical data line is preferably a substantially rigid electrical data track. By providing a substantially rigid track, the manufacturing process may be yet further simplified as compared to using electrically conductive wires. The or each electrical data track may have an elongate cross-section. The elongate cross-section may be substantially rectangular. The width of the or each electrical data track may be less than the width of the electrical power track. The or each external electrical data contact may be formed from a first end portion of the or each electrical data track. Alternatively, the or each external electrical data contact may be directly coupled to a first end of the electrical data track. The second end of the or each electrical data track may form a pin configured to electrically couple the data track to the electronic circuit board. The pin is preferably configured to be received in a corresponding hole in the electronic circuit board. The electrical data track may be formed from brass, phosphor bronze, copper, copper alloy, a copper and nickel alloy, copper beryllium alloy, or aluminium. The electrical data tracks are preferably formed from phosphor bronze. In a preferred embodiment, the aerosol-generating device comprises two electrical data tracks.

Where provided, the frame is preferably further configured to mechanically couple the or each electrical data line to the elongate conductive member. Further configuring the frame in this way enables the aerosol-generating device to be manufactured yet more easily. In known devices, the electrical data lines are electrical wires which are soldered into place, which is a time consuming and difficult operation. Utilising the frame to mechanically couple the or each electrical data line to the elongate conductive member of the ground plane advantageously enables the electrical connections between the device and each end of the electrical data line to be made more easily.

Preferably, the or each electrical data line is integrally moulded within the frame. Integrally moulding the or each electrical data line within the frame enables the electrical data line to be electrically insulated more easily, and again reduces the manufacturing time and complexity. As will be appreciated, the elongate conductive member, the electrical power line, and the or each electrical data line are preferably all integrally moulded with the frame in one operation.

The ground plane is preferably configured to form a cavity adapted to receive and retain the power supply. The cavity is preferably in the form of a channel having a width of the open portion of the channel less than the width of the power supply. At least the portion of the ground plane forming the channel is preferably resilient such that the power supply may be inserted into the channel by increasing the width of the open portion of the channel. Preferably, the inner surface of the channel is configured to electrically connect the power supply to the ground plane. By providing multiple electrical contact points a set of parallel resistances may be provided.

Preferably, the ground plane further comprises a plurality of resilient elements configured to retain the power supply. Preferably, each resilient element is an electrical contact configured to connect the ground plane to the power supply. The ground plane is preferably connected to the negative terminal of the power supply.

The plurality of resilient elements are preferably configured to retain the power supply utilising a snap-fit. The resilient elements are configured to be movable from a first position to a second position. In the second position, a gap is provided between the resilient elements suitable for receiving the power supply. In the first position, the resilient elements act on the power supply to retain it within the cavity formed in the ground plane.

That is to say, the power supply can be forced between the plurality of resilient elements such that the power supply is positioned on the ground plane within the resilient elements. During this process, the resilient elements are initially forced apart as the power supply passes between them, and once the widest portion of the power supply has passed through the resilient elements, the resilient elements snap back to their original position retaining the power supply within the ground plane.

The ground plane is preferably configured to be multi-faceted. The number of faces of the ground plane may not be constant along the longitudinal axis of the ground plane. Preferably, the portion of the ground plane forming the cavity comprises seven faces. In this case, two of the faces are formed by the resilient elements. The remaining portion of the ground plane preferably comprises three faces. By changing the number of faces along the longitudinal axis, the components of the aerosol generator may be coupled to the ground plane more easily.

Where provided, the frame may be configured to form the base of the channel provided to receive the power supply. An elongate longitudinal slot may be provided in the elongate conductive member for receiving the frame. Such a slot may reduce the size of the aerosol-generating device.

Preferably, the ground plane is configured to provide an electrical resistance between the power supply and the electronic circuit board of between about 10 milliohm (mΩ) and about 20 milliohm (mΩ). Advantageously, providing such a resistance enables the power supply to be utilised efficiently.

The ground plane is preferably manufactured from a single laminar sheet of conductive material. Preferably, the material is a metal, preferably brass. Utilising brass to manufacture the ground plane is advantageous because it is suitably malleable to allow the ground plane to be folded into the required shape, is suitable resilient to retain the power supply, and can be soldered to enable the circuit board to be connected. In addition, the use of brass enables a suitable electrical resistance to be provided between the components of the aerosol generating device. Alternatively, the material may comprise a copper alloy, a copper and nickel alloy, or copper beryllium alloy. The material may have a thickness of between about 0.05 mm and about 1.0 mm, and may preferably have a thickness of about 0.2 mm. It will now be apparent to one of ordinary skill in the art that other appropriate thicknesses can be determined based on bending resistance, thickness of the material used, and the required support.

The electrically operated aerosol-generating device preferably further comprises an electrical heating element configured to receive power from the electrical power supply via the electronic circuit board. The electrical heating element may be structurally supported by the frame. The electrical heater may comprise at least one internal heater. Preferably the internal heater is in the form of a blade. The blade is preferably configured to be insertable into the aerosol forming substrate. In addition, or instead of, the internal heater, the electrical heating element may comprise at least one external heater. The at least one external heater is preferably configured to at least partially surround the aerosol forming substrate, such that in use the aerosol forming substrate may be heated by the external heater. As such, the electrical heating element may comprise at least one internal heater, and at least one external heater.

The aerosol generating device may further comprise an aerosol forming substrate configured to form an aerosol when heated by the electrical heater. The aerosol-forming substrate may be provided in an aerosol-generating article.

Preferably, the power supply is a battery, more preferably a rechargeable battery. Where the power supply is a rechargeable battery, the external electrical power contact is configured to connect to an external power supply. The external power supply is configured to recharge the rechargeable battery.

The ground plane of the aerosol generating device is preferably mounted within a housing. A portion of the cross-sectional shape of the ground plane may be substantially similar to the equivalent portion of the cross-sectional shape of the housing. The cross-sectional shape of the housing may be polygonal, and may comprise 10 sides; that is to say, it may comprise 10 faces such that the housing is multi-faceted. Where the cross-sectional shape of the housing comprises 10 sides (faces), the ground plane preferably comprises seven sides with three sides (faces) not present. In this way, the three sides (faces) of the cross-sectional shape of the ground plane that are not present enable the components of the aerosol generating device to be inserted within the ground plane. In a preferred embodiment, the cross-sectional shape of the housing is circular, and the cross-sectional shape of the ground plane is polygonal.

The ground plane, and the components mounted thereto, may be provided within an elongate hollow tube, the tube then being mounted within the outer housing. The cross-sectional shape of the elongate hollow tube is preferably circular. The elongate hollow tube may be formed from aluminium. The elongate hollow tube may improve the durability of the device by providing additional protection to the ground plane and electrical components during both use and manufacture. The longitudinal length of the elongate hollow tube is preferably greater than the longitudinal length of the ground plane. More preferably, the longitudinal length of the elongate hollow tube is greater than the total longitudinal length of the ground plane and the heating element when mounted to the ground plane. In this way, the elongate hollow tube may form a cavity for receiving an aerosol-generating article. In addition, by providing the elongate hollow tube which extends to cover the heating element, the heating element is protected during manufacture. Furthermore, the coefficient of friction between the inside surface of the elongate hollow tube and the aerosol-generating article is preferably such that it is easier to remove the aerosol-generating article from the device as compared to a device not comprising the elongate hollow tube.

According to a further aspect of the present invention, there is provided a ground plane for an electrically operated aerosol-generating device. The ground plane comprises: an electrical power line; and an elongate conductive member configured to: electrically couple a power supply to an electronic circuit board of the electrically operated aerosol-generating device; and structurally retain the power supply and the electronic circuit board of the electrically operated aerosol-generating device. The ground plane further comprises: means for electrically insulating the electrical power line from the elongate conductive member; and means for mechanically coupling the electrical power line to the elongate conductive member.

Advantageously, providing such a monolithic ground plane reduces the complexity of the manufacturing process because the components can be coupled both electrically and structurally before being inserted into the housing of an aerosol generating device.

The ground plane may further comprise a frame, structurally retained by the elongate conductive member, configured to mechanically couple the electrical power line to the elongate conductive member. The electrical power line may be integrally moulded within the frame, the frame being formed from an electrical insulator.

The ground plane may further comprise at least one electrical data line integrally moulded within the frame, and configured to be electrically coupled to the electronic circuit board.

Preferably, the elongate conductive member comprises a plurality of elongate portions, wherein a first elongate portion is connected to a further elongate portion along one longitudinal edge, a second elongate portion is connected to a further elongate portion along one longitudinal edge, and the remaining elongate portions are connected along both longitudinal edges, such that the ground plane may be formed having a polygonal cross-section with at least one side not present. Providing a plurality of elongate portions, each portion preferably being planar, advantageously, improves the electrical contact between the ground plane and the power supply.

The ground plane preferably further comprises two sets of resilient elements configured to structurally retain the power supply, wherein the first set of resilient elements are connected to the first elongate portion and the second set are connected to the second elongate portion. Preferably, each set of resilient elements comprises a plurality of resilient elements. Each set may comprise 2, 3, 4, 5, most preferably 6, or more, resilient elements.

The ground plane may comprise an elongate longitudinal slot for receiving the, where provided, frame.

Any feature in one aspect of the invention may be applied to other aspects of the invention, in any appropriate combination. In particular, method aspects may be applied to apparatus aspects, and vice versa. Furthermore, any, some and/or all features in one aspect can be applied to any, some and/or all features in any other aspect, in any appropriate combination.

It should also be appreciated that particular combinations of the various features described and defined in any aspects of the invention can be implemented and/or supplied and/or used independently.

The disclosure extends to methods and apparatus substantially as herein described with reference to the accompanying drawings.

As used herein, means plus function features may be expressed alternatively in terms of their corresponding structure.

FIG. 1 shows a cross-sectional view of ground plane 100 for an aerosol-generating device. The aerosol generating device is described in further detail below. The ground plane comprises an elongate conductive member (not shown), an electrical power track 102, a first electrical data track 104, a second electrical data track 106, an externally facing electrical power contact 124, an externally facing electrical data contact 126, and a frame 108. A power supply 110, and an electronic circuit board 112 are both structurally and electrically coupled to the ground plane 100. The elongate conductive member comprises a plurality of electrically conductive pins 114 for coupling the negative terminal of the power supply 110 to the electronic circuit board. The positive terminal of the power supply is coupled to the electronic circuit board by cable 116. The ground plane is an electrically conductive surface that appears as an infinite ground potential to the components of the electrically operated aerosol generating device.

The electrical tracks 102, 104 and 106 each have a first end configured to be exposed from the frame 108. The first end of each electrical track is either further configured to form an externally facing electrical power contact 124 for coupling to an external device, or further configured to be coupled to electrically conductive pads or contacts for coupling to the external device. In addition, the electrical tracks 102, 104 and 106 also each comprise, at a second end, a respective pin 118, 120, and 122 for coupling the electrical track to the electronic circuit board 112.

The elongate conductive member is manufactured by stamping a single laminar blank. The single laminar blank is then folded in a single process to form a multi-faceted elongate conductive member. Utilising a plurality of faces for the elongate conductive member enables a simple folding process to be used. However, an alternative bending process may be used to form a curved cross-sectional profile. The elongate conductive member is manufactured from brass. Utilising brass enables the elongate conductive member to be folded easily, and allows components to be soldered to the elongate conductive member where necessary.

Figure 2:
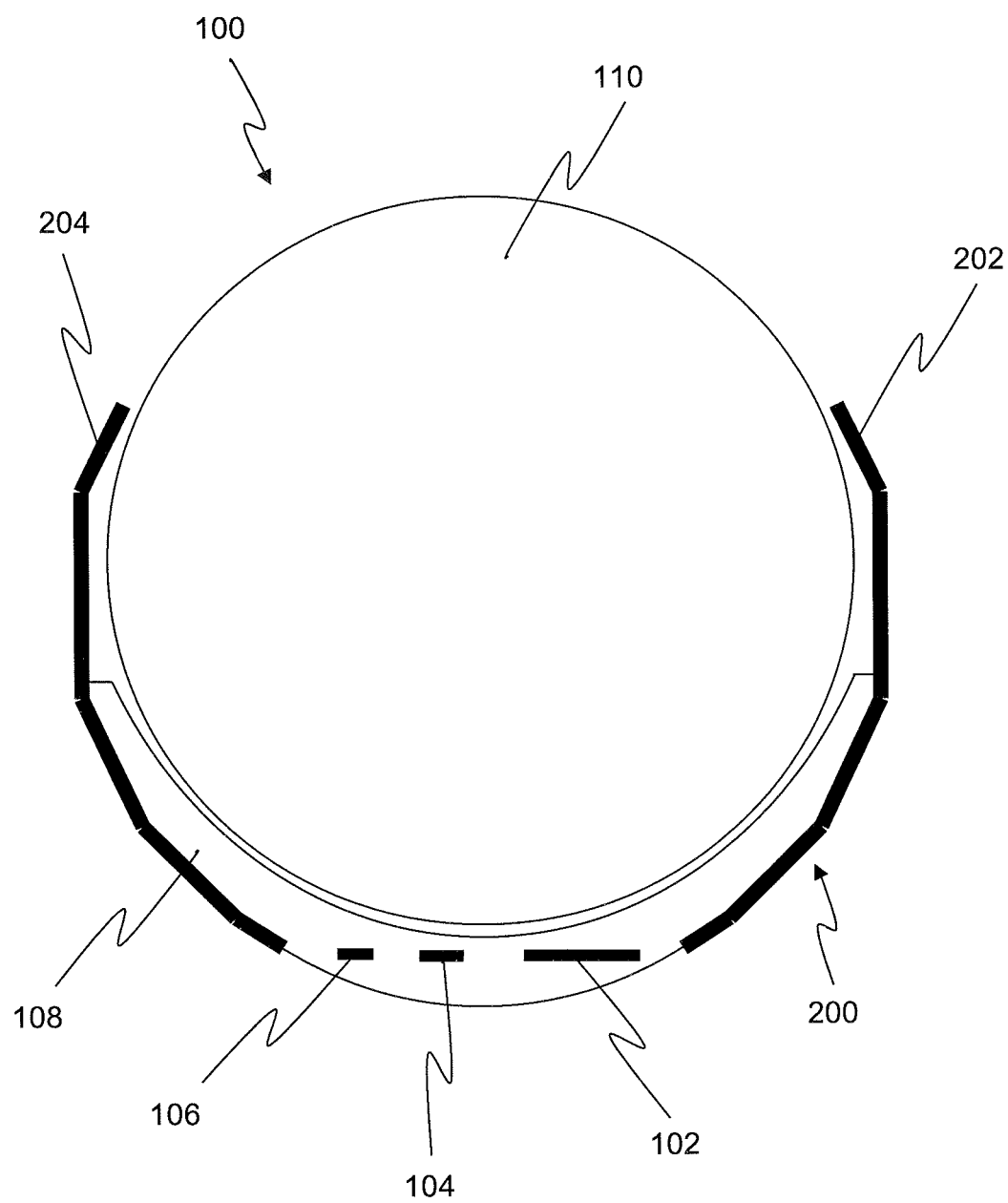
FIG. 2 shows cross-section A-A of the ground plane shown in FIG. 1.

FIG. 2 shows the cross-section A-A of the ground plane 100 shown in FIG. 1. As can be seen, the elongate conductive member 200 forms a cavity in which the power supply 110, in the form of a rechargeable battery, can be received. The elongate conductive member is formed from a plurality of elongate elements configured to form the cavity along at least a portion of the ground plane. The cavity is bounded by the plurality of elongate elements, and the resilient elements 202, and 204. The resilient elements 202 and 204 are configured to structurally retain the power supply 110 within the cavity, and to electrically couple the negative terminal of the power supply 110 to the ground plane 100.

During assembly, the power supply 110 is pushed into the cavity. The resilient elements 202 and 204 spread apart as the power supply acts on the resilient elements, and when the power supply has passed through the opening between the resilient elements they move back to retain the power supply within the cavity of the ground plane 100. Utilising resilient elements in such a way reduces the complexity of manufacturing an aerosol generator. In addition, utilising the resilient elements as electrical connectors between the power supply and the ground plane provides parallel resistance paths that increases the efficiency of the device.

As can be further seen from FIG. 2, the electrical power track 102 and the electrical data tracks 104 and 106 are integrally moulded within the frame 108. The frame 108 is also integrally moulded with the elongate conductive member 200. As can be seen, the frame has a plurality of functions. Firstly, the electrical tracks 102, 104, and 106 are structurally retained in the ground plane by the frame. Secondly, the frame electrically insulates the electrical tracks 102, 104, and 106 from the elongate conductive member 200. Finally, the frame 108 acts as a support for the power supply 110. The frame is moulded, such as by injection moulding, from polyphthalamide (PPA). By integrally moulding the elongate conductive member, the frame and the electrical tracks the manufacturing process may be simplified, because no further additional electrical wires are required to connect the external contacts to the electronic circuit board as are required in known aerosol-generating devices.

Figure 3:
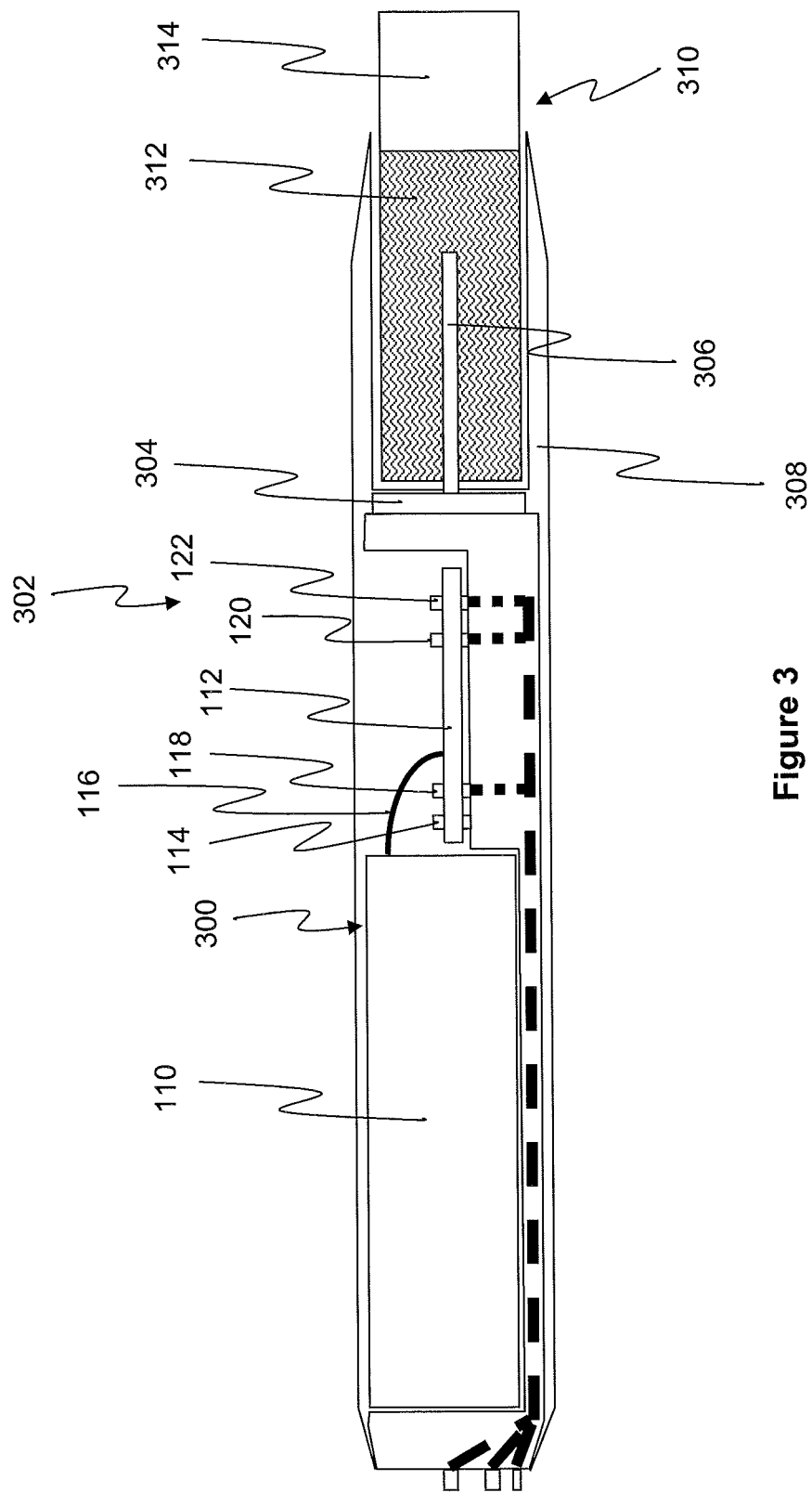
FIG. 3 shows a cross-sectional view of a schematic representation of an aerosol-generating device according to one embodiment of the present invention.

FIG. 3 shows an aerosol-generating device 300 and aerosol-generating system 302 comprising the ground plane 100 shown in FIGS. 1 and 2. As discussed above, the electronic circuit board 112 is mounted to the elongate conductive element 200 and to the electrical tracks 102, 104, and 106 by the respective pins 114, 118, 120, and 122. The electronic circuit board 112, once placed on the pins, is soldered in place. The device further comprises an electrical heater 304 mounted to the frame 108 and elongate conductive member 200. The electrical heater 304 comprises a heating element 306. As will be appreciated from the above description, the power supply, electronic circuit board, and electrical heater are all electrically coupled together by the ground plane.

The respective end portions of the electrical tracks 102, 104, and 106 may be coupled to an interface circuit board (not shown) which comprises external connectors, and internal circuitry. The external connectors are mounted directly to one side of the circuit board. Likewise, the circuitry is mounted directly to the other side of the circuit board. The external connectors are connected to the circuitry via connections through the circuit board. The device 300 may be coupled to an external device for charging and for the transfer of data. As will be appreciated, the external contacts of the device 300 are configured to electrically couple to the external device to enable the transfer of electrical power and data.

The ground plane 100, comprising the power supply 110, circuit board 112, and electrical heater 304 is mounted within an external housing 308 to form an electrically operated aerosol generating device 300. By providing all of the components of the aerosol generating device on a monolithic sub-structure the device can be manufactured more easily. The ground plane is inserted into the housing of the device such that the external connectors are exposed at one end of the device. Those end portions are coupled to the interface board.

The housing of the device incorporates a cavity configured to surround the heater 306. The heater cavity is adapted to receive an aerosol-generating article 310. The aerosol-generating article 310 comprises an aerosol-forming substrate 312 and a mouthpiece element 314, such as a filter. The aerosol-forming article 310 may comprise further elements, such as a cooling element, or flavour-release element.

The housing 308 has a regular polygonal cross-sectional shape comprising 10 sides, and as can be seen, the ground plane has an equivalent cross-sectional shape, but with three sides not present in the region of the power supply.

In use, the heating element receives power from the power supply via the circuit board in order to heat the aerosol-forming substrate to form an aerosol.

Figure 4:
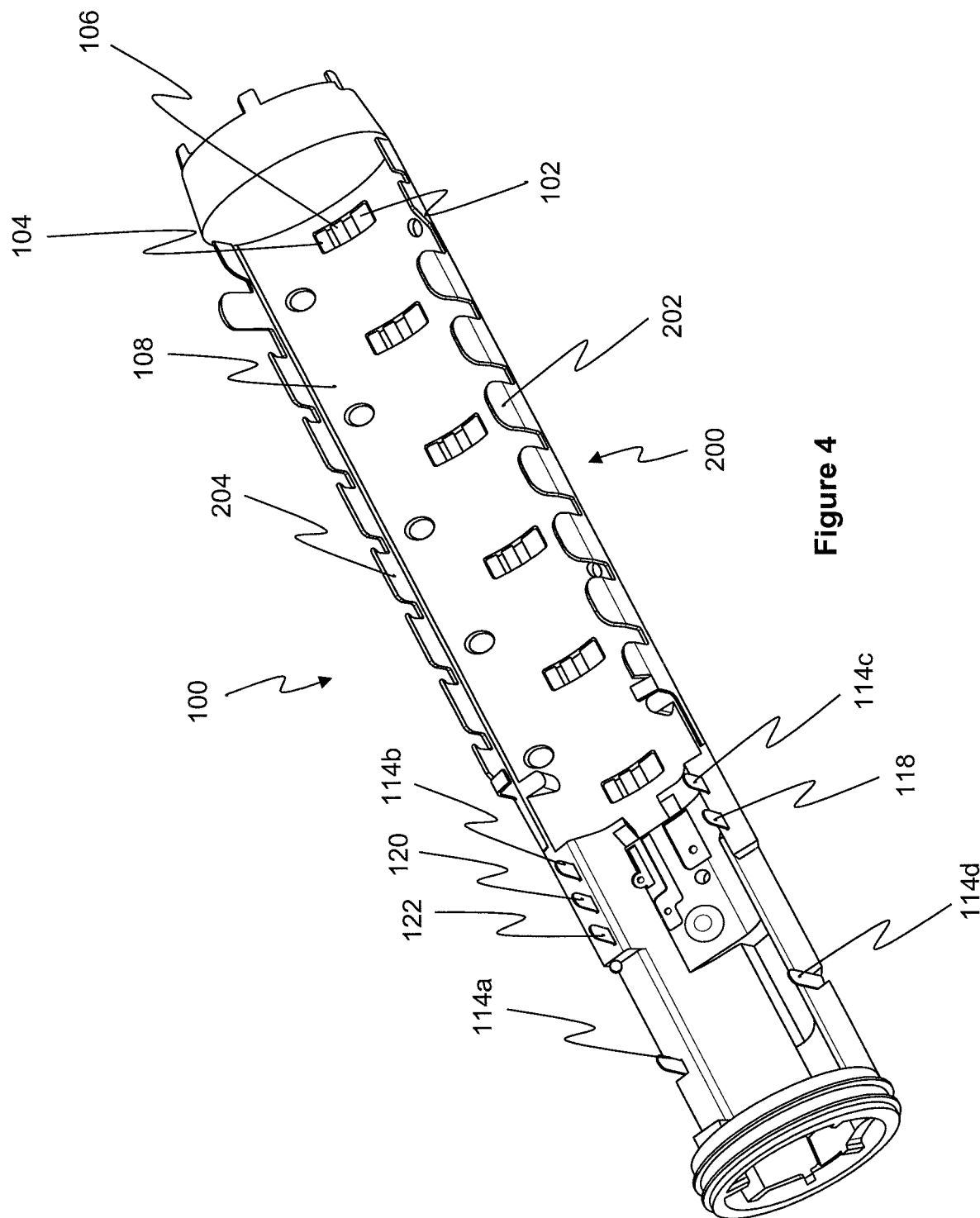
FIG. 4 shows a perspective view of a ground plane according to one embodiment of the present invention.

FIG. 4 shows the ground plane 100 without the power supply 110, electronic circuit board 112 or other components attached. The elongate conductive member 200 extends around at least a portion of the frame 108. As described above, the electrical tracks 102, 104 and 106 extend along the longitudinal length of the ground plane, and are provided within the frame 108. The pins 114a, 114b, 114c and 114d of the elongate conductive member 200 are arranged substantially parallel to each other and are configured to receive the electronic circuit board. The frame 108 is configured to provide structural support to the electronic circuit board 112 in the region of the pins, and structural support to the power supply 110, and the heater 304.

The pins 118, 120, and 122 of the respective electrical tracks 102, 104, and 106 are also arranged substantially parallel to the pins 114 and each other. Similarly, the pins 114, 118, 120, and 122 are configured to receive the electronic circuit board 112.

The invention claimed is:

1. An electrically operated aerosol-generating device, comprising:
    an electrical power supply;
    an electronic circuit board;
    an externally facing electrical power contact;
    an electrical power line, configured to electrically couple the externally facing electrical power contact to the electronic circuit board; and
    a ground plane, being an electrically conductive surface that appears as an infinite ground potential to the components of the electrically operated aerosol generating device, the ground plane comprising:
        an elongate conductive member connected to a negative terminal of the electrical power supply and being configured to electrically couple the power supply to the electronic circuit board, and to structurally retain the electrical power supply and the electronic circuit board, and
        means for electrically insulating the electrical power line from, and mechanically coupling the electrical power line to, the elongate conductive member.

2. The electrically operated aerosol-generating device according to claim 1, wherein the electrical power line is a substantially rigid electrical power track.

3. The electrically operated aerosol-generating device according to claim 1, wherein the means for electrically insulating the electrical power line from, and mechanically coupling the electrical power line to, the elongate conductive member is a frame being structurally retained by the elongate conductive member.

4. The electrically operated aerosol-generating device according to claim 3, wherein the frame is further configured to support the electrical power supply and the electronic circuit board.

5. The electrically operated aerosol-generating device according to claim 3, wherein the electrical power line is integrally molded within the frame, the frame being formed from an electrical insulator.

6. The electrically operated aerosol-generating device according to claim 3, wherein the frame is integrally molded with the elongate conductive member.

7. The electrically operated aerosol-generating device according to claim 1, further comprising:
    at least one externally facing electrical data contact; and
    at least one electrical data line, configured to electrically couple the externally facing electrical data contact to the electronic circuit board,
    wherein the at least one electrical data line is electrically insulated from the ground plane and from the electrical power line, and
    wherein the ground plane further comprises means for mechanically coupling the at least one electrical data line to the elongate conductive member.

8. The electrically operated aerosol-generating device according to claim 7, wherein the at least one electrical data line is a substantially rigid electrical data track.

9. The electrically operated aerosol-generating device according to claim 1, further comprising an electrical heating element configured to receive power from the electrical power supply via the electronic circuit board.

10. An electrically operated aerosol-generating device, comprising:
    an electrical power supply;
    an electronic circuit board;
    at least one externally facing electrical data contact;
    at least one electrical data line, configured to electrically couple the externally facing electrical data contact to the electronic circuit board;
    an externally facing electrical power contact;
    an electrical power line, configured to electrically couple the externally facing electrical power contact to the electronic circuit board; and
    a ground plane, being an electrically conductive surface that appears as an infinite ground potential to the components of the electrically operated aerosol generating device, the ground plane comprising:
        an elongate conductive member connected to a negative terminal of the electrical power supply and being configured to electrically couple the power supply to the electronic circuit board, and to structurally retain the electrical power supply and the electronic circuit board, and
        a frame being structurally retained by the elongate conductive member and being configured to:
            electrically insulate the electrical power line from, and mechanically couple the electrical power line to, the elongate conductive member, and mechanically couple the at least one electrical data line to the elongate conductive member,
wherein the at least one electrical data line is electrically insulated from the ground plane and from the electrical power line.

11. The electrically operated aerosol-generating device according to claim 10, wherein the at least one electrical data line is integrally molded within the frame.

12. The electrically operated aerosol-generating device according to claim 10, further comprising an electrical heating element configured to receive power from the electrical power supply via the electronic circuit board.

* * * * *